(12) United States Patent
Qu et al.

(10) Patent No.: US 9,287,416 B2
(45) Date of Patent: Mar. 15, 2016

(54) SCHOTTKY DIODE

(71) Applicant: Robert Bosch GmbH, Stuttgart (DE)

(72) Inventors: Ning Qu, Reutlingen (DE); Alfred Goerlach, Kusterdingen (DE)

(73) Assignee: ROBERT BOSCH GMBH, Stuttgart (DE)

(*) Notice: Subject to any disclaimer, the term of this patent is extended or adjusted under 35 U.S.C. 154(b) by 0 days.

(21) Appl. No.: 14/522,789

(22) Filed: Oct. 24, 2014

(65) Prior Publication Data
US 2015/0041830 A1 Feb. 12, 2015

Related U.S. Application Data

(62) Division of application No. 13/503,439, filed as application No. PCT/EP2010/064003 on Sep. 23, 2010, now abandoned.

(30) Foreign Application Priority Data

Nov. 11, 2009 (DE) .......... 10 2009 046 596

(51) Int. Cl.
| | |
|---|---|
| H01L 29/872 | (2006.01) |
| H01L 29/861 | (2006.01) |
| H01L 29/06 | (2006.01) |
| H01L 29/16 | (2006.01) |
| H01L 29/20 | (2006.01) |
| H01L 29/47 | (2006.01) |
| H01L 29/66 | (2006.01) |

(52) U.S. Cl.
CPC .......... *H01L 29/872* (2013.01); *H01L 29/0615* (2013.01); *H01L 29/1608* (2013.01); *H01L 29/2003* (2013.01); *H01L 29/47* (2013.01); *H01L 29/475* (2013.01); *H01L 29/66136* (2013.01); *H01L 29/66143* (2013.01); *H01L 29/8611* (2013.01)

(58) Field of Classification Search
CPC .......... H01L 29/0878; H01L 29/7824; H01L 29/861; H01L 29/0649–29/0653
USPC .................................................. 257/476, 471
See application file for complete search history.

(56) References Cited

U.S. PATENT DOCUMENTS

| | | | |
|---|---|---|---|
| 7,692,262 B2 | 4/2010 | Morand et al. | |
| 2005/0006662 A1* | 1/2005 | Morand | H01L 27/0788 257/107 |

(Continued)

FOREIGN PATENT DOCUMENTS

| | | |
|---|---|---|
| DE | 102004053761 | 5/2006 |
| EP | 1496549 | 1/2005 |
| WO | WO 2006048387 | 5/2006 |

OTHER PUBLICATIONS

International Search Report, PCT International Application No. PCT/EP2010/064003, dated Dec. 30, 2010.

(Continued)

*Primary Examiner* — Kenneth Parker
*Assistant Examiner* — Bo Fan
(74) *Attorney, Agent, or Firm* — Kenyon & Kenyon LLP

(57) ABSTRACT

A semiconductor system of a Schottky diode is described having an integrated PN diode as a clamping element, which is suitable in particular as a Zener diode having a breakdown voltage of approximately 20 V for use in motor vehicle generator systems. The semiconductor system of the Schottky diode includes a combination of a Schottky diode and a PN diode. The breakdown voltage of the PN diode is much lower than the breakdown voltage of the Schottky diode, the semiconductor system being able to be operated using high currents during breakdown operation.

17 Claims, 3 Drawing Sheets

(56) References Cited

U.S. PATENT DOCUMENTS

2006/0231867 A1* 10/2006 Takahashi ............ H01L 29/0878
                                                        257/216
2007/0272979 A1* 11/2007 Saito ................... H01L 29/0634
                                                        257/335
2008/0197439 A1     8/2008 Goerlach et al.
2008/0246084 A1* 10/2008 Ono .................... H01L 29/0634
                                                        257/341

OTHER PUBLICATIONS

Hossain, Z., et al., "Forward Drop-Leakage Current Tradeoff Analysis of a Junction Barrier Schottky (JBS) Rectifier," *Power Semiconductor Devices and ICS*, Toronto, pp. 265-268 (1999).

Kozaka, H., et al., "Low Leakage Current Schottky Barrier Diode," *Proceedings of 1992 International Symposium on Power Semiconductors & ICs*, Tokyo, pp. 80-85 (1992).

\* cited by examiner

SCHOTTKY DIODE

CROSS-REFERENCE TO RELATED APPLICATIONS

The present application is a divisional application of U.S. patent application Ser. No. 13/503,439, filed Jun. 29, 2012, which is a national phase to International Application No. PCT/EP2010/064003, filed Sep. 23, 2010, and claims priority to German Patent Application No. 10 2009 046 596.0, filed Nov. 11, 2009, all of which are hereby incorporated by reference in their entireties.

FIELD OF THE INVENTION

The present invention relates to a semiconductor system of a Schottky diode, which has a small leakage current and low forward voltage, which may be manufactured with the aid of relatively simple technology, and is suitable in particular as a Zener (Z) power diode having a breakdown voltage of approximately 20 V for use in motor vehicle generator systems.

BACKGROUND INFORMATION

More and more functions are being implemented using electrical components in modern motor vehicles. An ever higher demand for electrical power thus arises. In order to cover this demand, the efficiency of the generator system in the motor vehicle must be increased. Up to this point, PN diodes were typically used as the Z diodes in the motor vehicle generator system. Advantages of the PN diodes are, on the one hand, the low reverse current and, on the other hand, the high robustness. The main disadvantage is the high forward voltage UF. At room temperature, current does not begin to flow until UF=0.7 V.

Under normal operating conditions, e.g., a current density of 500 A/cm², UF rises to >1 V, which means a non-negligible loss of efficiency.

Schottky diodes are theoretically available as an alternative. Schottky diodes have a significantly lower forward voltage than PN diodes, for example, 0.5 V to 0.6 V at a high current density of 500 A/cm². In addition, Schottky diodes offer advantages during rapid switching operation as majority carrier components. The use of Schottky diodes in motor vehicle generator systems has heretofore not occurred, however. This is to be attributed to several decisive disadvantages of Schottky diodes: 1) higher reverse current in comparison to PN diodes, 2) strong dependence of the reverse current on the reverse voltage, and 3) poor robustness, in particular at high temperature. Therefore, there are ideas and concepts for improving Schottky diodes. Two examples are described below.

So-called junction barrier Schottky diodes (JBS) are described in H. Kozaka, etc., "Low leakage current Schottky barrier diode," Proceedings of 1992 International Symposium on Power Semiconductors & ICs, Tokyo, pp. 80-85. As may be inferred from FIG. 1, a JBS includes an n⁺-substrate 1, an n-epitaxial layer 2, at least two p-wells 3 diffused into n-epitaxial layer 2, and metal layers on front side 4 and rear side 5 of the chip. Electrically considered, the JBS is a combination of a PN diode, i.e., a PN junction between p-wells 3 as the anode and n-epitaxial layer 2 as the cathode and a Schottky diode having the Schottky barrier between metal layer 4 as the anode and n-epitaxial layer 2 as the cathode. The metal layer on rear side 5 of the chip is used as the cathode electrode; the metal layer on front side 4 of the chip is used as the anode electrode having ohmic contact to p-wells 3 and simultaneously as the Schottky contact to n-epitaxial layer 2.

Because of the small forward voltage of the Schottky diode in comparison to the PN diode, currents only flow in the forward direction through the area of the Schottky diode. As a result, the effective area, i.e., the area per unit of area for the current flow in the forward direction, is significantly lower in a JBS than in a conventional planar Schottky diode.

In the reverse direction, the space charge regions expand with increasing voltage and collide in the middle of the area between adjacent p-wells 3 at a voltage which is lower than the breakdown voltage of the JBS. The Schottky effect, or barrier lowering effect, which is responsible for the high reverse currents, is thus partially shielded and the reverse current is reduced. This shielding effect is strongly dependent on structural parameters Xjp (penetration depth of the p-diffusion), Wn (distance between the p-wells), and Wp (width of the p-well) and of doping concentrations of p-well 3 and n-epitaxial layer 2, see FIG. 1.

P-wells 3 of a JBS may be implemented via p-implantation and subsequent p-diffusion. Through lateral diffusion in the x-direction, whose depth is comparable to the vertical diffusion in the y-direction, cylindrical p-wells result in the two-dimensional illustration, i.e., infinite length in the z-direction perpendicular to the x-y-plane, whose radius corresponds to penetration depth Xjp. Because of the radial extension of the space charge regions, this form of p-wells does not display very effective shielding of the barrier lowering effect. It is not possible to amplify the shielding effect solely through deeper p-diffusion, since the lateral diffusion correspondingly becomes wider at the same time.

Decreasing distance Wn between the p-wells is also not a good solution, since in this way the shielding effect is amplified, but the effective area for the current flow in the forward direction is reduced some more.

An alternative for improving the shielding effect of the barrier lowering effect of a JBS is the so-called trench junction barrier Schottky diode TJBS having filled trenches, which is described in German Patent Application No. DE 10 2004 053 761 A. FIG. 2 shows such a TJBS. It includes an n⁺-substrate 1, an n-epitaxial layer 2, at least two trenches 6, which are etched into n-epitaxial layer 2, and metal layers on front side 4 of the chip as the anode electrode and on rear side 5 of the chip as the cathode electrode. The trenches are filled up using p-doped silicon or polysilicon 7. In particular, metal layer 4 may also be made up of multiple different metal layers lying upon each other. For the sake of clarity, this is not shown in FIG. 2.

Considered electrically, the TJBS is a combination of a PN diode having a PN junction between p-doped trenches 7 as the anode and n-epitaxial layer 2 as the cathode and a Schottky diode having the Schottky barrier between metal layer 4 as the anode and n-epitaxial layer 2 as the cathode. As in a conventional JBS, currents only flow in the forward direction through the Schottky diode. Because of a lack of lateral p-diffusion, however, the effective area for current flow in the forward direction is significantly greater in the TJBS than in a conventional JBS. In the reverse direction, the space charge regions expand with increasing voltage and collide in the middle of the area between adjacent trenches 6 at a voltage which is lower than the breakdown voltage of the TJBS. As in the JBS, the barrier lowering effect which is responsible for high reverse currents is thus shielded and the reverse currents are reduced. The shielding effect is strongly dependent on structural parameters Dt (depth of the trench), Wm (distance between the trenches), and Wt (width of the trench) and of doping concentrations of p-well 7 and n-epitaxial layer 2, see FIG. 2.

The p-diffusion is omitted for implementing the trenches in the TJBS. Therefore, there is no negative effect of lateral p-diffusion as in a conventional JBS. A quasi-one-dimensional expansion of the space charge regions in the mesa area between trenches 6 may be readily implemented, since depth Dt of the trench, an important structural parameter for the shielding of the Schottky effect, no longer correlates with the effective area for current flow in the forward direction. The shielding effect of Schottky effects is therefore significantly more effective than in the JBS having diffused p-wells.

On the other hand, the TJBS offers a high robustness through its clamping function. Breakdown voltage BV_pn of the PN diode is designed in such a way that BV_pn is lower than breakdown voltage BV_schottky of the Schottky diode and the breakdown occurs on the base of the trenches. During breakdown operation, the reverse current only flows through the PN junction. Forward direction and reverse direction are therefore geometrically separated. The TJBS therefore has a similar robustness as a PN diode. As a result thereof, the TJBS is well suitable as a Z diode for use in motor vehicle generator systems.

SUMMARY

An advantage of an example embodiment of the present invention is that of providing a semiconductor system of a Schottky diode having a small leakage current, low forward voltage, and high robustness, which may be manufactured with the aid of relatively simple technologies and is suitable as a Z power diode for use in motor vehicle generator systems.

In a particularly advantageous way, the Schottky diode of the present invention is a combination of a PN diode having a low breakdown voltage and a Schottky diode having a much higher breakdown voltage. This is implemented by different doping profiles, which determine the different breakdown voltages of the PN diode and the Schottky diode. The electrical field strength at the Schottky contact is thus sufficiently strongly reduced that a complex submicrometer trench technology for effective suppression of the barrier lowering effect, as in a TJBS or a TMBS, is no longer required.

In comparison to the JBS, a significantly lower leakage current is advantageously obtained through significantly lower electrical field strength at the Schottky contact. In comparison to the TJBS, a comparable leakage current flows and comparable robustness is obtainable with the special advantage of significantly simpler manufacturing technology.

DETAILED DESCRIPTION OF EXAMPLE EMBODIMENTS

Figure 1:
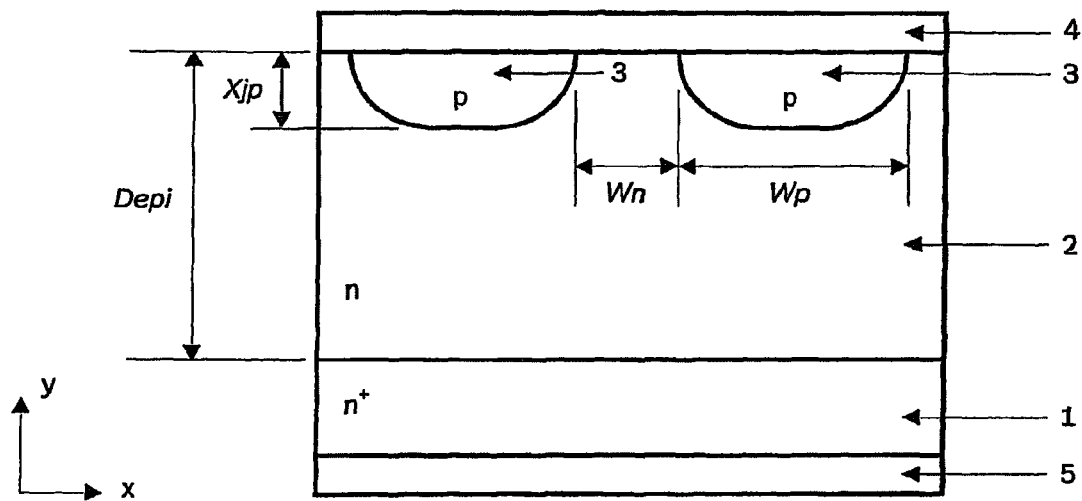
FIG. 1 shows a junction barrier Schottky diode (JBS).
Figure 2:
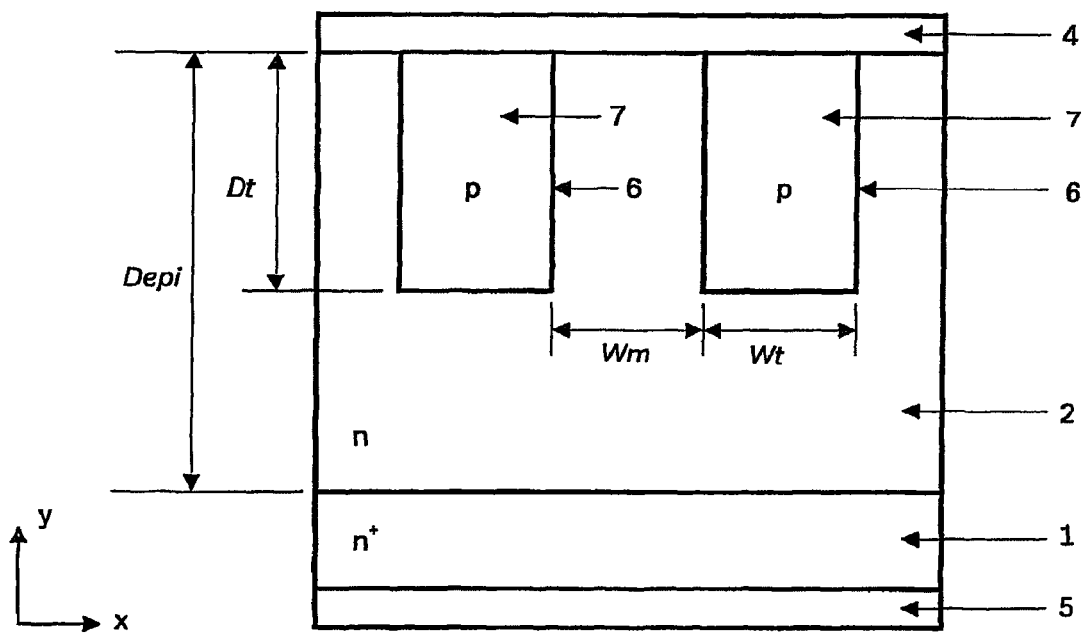
FIG. 2 shows a trench junction barrier Schottky diode (TJBS) having a filled trench.

In a conventional JBS according to FIG. 1 or a TJBS according to FIG. 2, the same n-epitaxial layer is typical, which is used as the cathode zone of the Schottky diode and the cathode zone of the integrated PN diode. Breakdown voltage BV_schottky of the Schottky diode is, inter alia, not much higher than breakdown voltage BV_pn of the integrated PN diode. Therefore, a high electrical field strength also occurs at the Schottky contact in the event of a breakdown of the PN diode and, as a result, the barrier lowering effect also occurs, which results in the high leakage current. To suppress the barrier lowering effect, or to reduce the leakage current, in a JBS or a TJBS, a collision of the space charge regions between the p-doped areas is utilized. This is not particularly pronounced in a JBS because of the two-dimensional effect of the diffused PN junctions. On the other hand, the TJBS requires a high technological outlay to implement the fine trench structures.

The barrier lowering effect increases with increasing reverse voltage. The higher the electrical field strength at the Schottky contact, the lower is the Schottky barrier. If the electrical field strength at the Schottky contact may be kept relatively low, e.g., approximately 1E5 V/cm, the effect of the voltage dependency of the barrier lowering effect is negligible. This may be implemented if a Schottky diode having an integrated PN diode is designed in such a way that breakdown voltage BV_schottky of the Schottky diode is selected to be much higher than breakdown voltage BV_pn of the integrated PN diode. However, with an increase of the breakdown voltage BV_schottky of a Schottky diode, the voltage drop during operation in the forward direction also increases, on the other hand. For this reason, high breakdown voltages BV_schottky are avoided and the Schottky diode is designed in such a way that BV_schottky is only slightly higher than BV_pn. Using the measure proposed in the present invention, the Schottky diodes for reverse current reduction may be designed for substantially higher breakdown voltages, without the forward voltage rising strongly.

Figure 3:
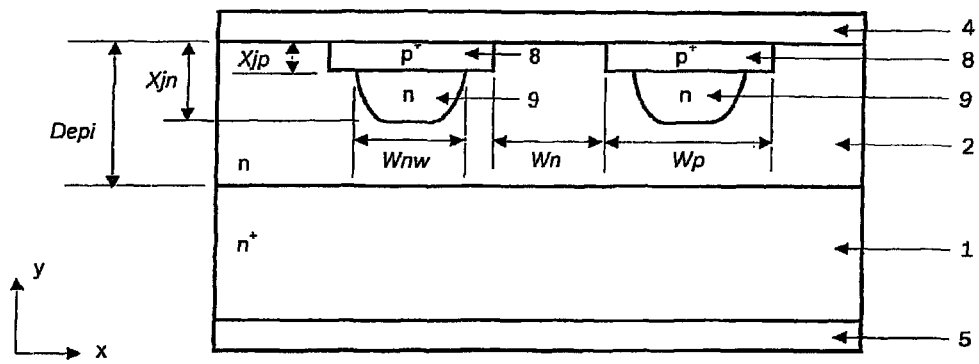
FIG. 3 shows a first exemplary embodiment of a semiconductor system according to the present invention of a Schottky diode.
Figure 3A:
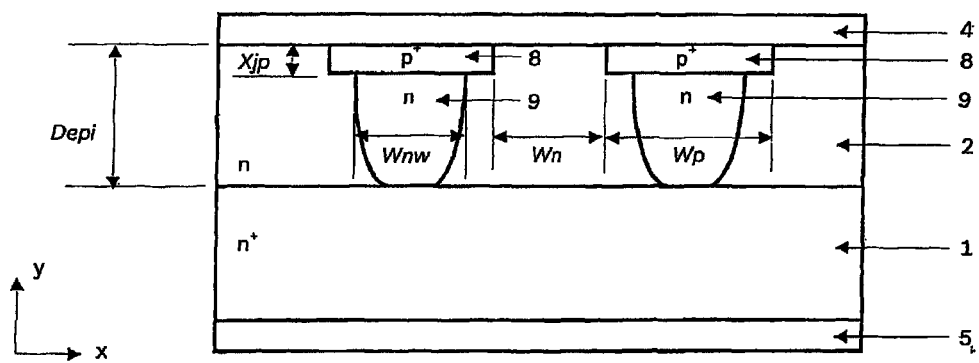
FIG. 3a shows an embodiment of the first exemplary embodiment.

The first exemplary embodiment of the present invention is shown in FIGS. 3 and 3a. This semiconductor system of a Schottky diode variant includes an $n^+$-substrate 1, an n-epitaxial layer 2, n-wells 9, which are diffused into n-epitaxial layer 2, having a width Wnw and a depth Xjn, $p^+$-wells 8, which are diffused into n-epitaxial layer 2 and into n-wells 9, having a width Wp and a depth Xjp, and a distance Wn between adjacent $p^+$-wells 8, which form PN junctions together with n-wells 9, and metal layers on front side 4 of the chip as the anode electrode and on rear side 5 of the chip as the cathode electrode. Depth Xjn of n-wells 9 is greater than depth Xjp of $p^+$-wells 8, and width Wnw of n-wells 9 is smaller than width Wp of $p^+$-wells 8. As shown in FIG. 3a, the depth of n-wells 9 may also extend, inter alia, up to $n^+$-substrate 1 or even beyond it.

This Schottky diode variant is a combination of a Schottky diode having a Schottky barrier between metal layer 4 as the anode and n-epitaxial layer 2 as the cathode and a PN diode having a PN junction between $p^+$-well 8 as the anode and n-well 9 as the cathode.

In contrast to the JBS shown in FIG. 1, the integrated PN diode of the Schottky diode of the present invention is no longer implemented with the aid of p-wells diffused relatively deeper into the n-epitaxial layer. The integrated PN diode now includes n-wells 9 diffused into n-epitaxial layer 2 and the relatively flatter $p^+$-wells 8. The Schottky diode is formed, as in the conventional JBS, from the Schottky contact and the n-epitaxial layer; the doping concentration of n-epitaxial layer 2 is much lower, however, than the doping concentration of n-wells 9. The doping profiles of n-wells 9 and $p^+$-wells 8 are set in such a way that breakdown voltage $BV_{pn}$ of the PN diode is approximately 20 V. In addition, n-epitaxial layer 2 is designed to be sufficiently thick so that breakdown voltage BV_schottky of the Schottky diode is much higher than BV_pn, e.g., $BV_{pn}$=20 V and BV_schottky>60 V.

The electrical field strength at the Schottky contact is thus significantly lower upon the breakdown of the Schottky diode of the present invention than the electrical field strength at the PN junction, e.g., approximately 1E5 V/cm instead of 5E5 V/cm. The Schottky diode described here is therefore also not in the range in which the voltage-dependent barrier lowering effect plays a role in the breakdown state. Suppressing the barrier lowering effect by collision of the space charge regions and thus reducing the leakage current is a completely different concept than in the conventional JBS or the TJBS shown in FIG. 2. In comparison to the conventional JBS, the reduction of the leakage current in the Schottky diode of the present invention is much more effective, since the voltage-dependent barrier lowering effect does not occur at all. In comparison to the TJBS shown in FIG. 2, the technology outlay is much less in the Schottky diode of the present invention, since submicrometer trench technology for implementing fine trench structures for effective suppression of the barrier lowering effect is not necessary.

As in a conventional JBS or a TJBS, in the semiconductor system of a Schottky diode of the present invention, currents flow in the forward direction only through the Schottky diode if the forward voltage of the Schottky diode is significantly lower than the forward voltage of the PN diode. However, n-wells 9 are additionally used for the purpose of reducing the forward voltage, since the forward current will partially flow through more strongly doped n-wells 9. The path resistance of the Schottky diode is advantageously reduced by n-wells 9.

The Schottky diode of the present invention offers high robustness due to the clamping function, like a TJBS shown in FIG. 2, since the breakdown also occurs at the PN junction, which is located deep in the silicon, and reverse currents flow only through the PN junction during breakdown operation. The Schottky diode of the present invention therefore has similar robustness as a PN diode. It is to be noted that the PN diode of the Schottky diode of the present invention includes a largely one-dimensional PN junction, since width Wnw of n-wells 9 is smaller than width Wp of $p^+$-wells 8, and this results in a homogeneous current distribution during the breakdown and high robustness.

Numerous parameters may be optimized depending on the application with respect to forward voltage, leakage current, and robustness in the design of the Schottky diode of the present invention. The doping concentration and the thickness of n-epitaxial layer 2 play a decisive role in particular. If needed, a graduated profile of n-epitaxial layer 2 may be advantageous.

Figure 4:
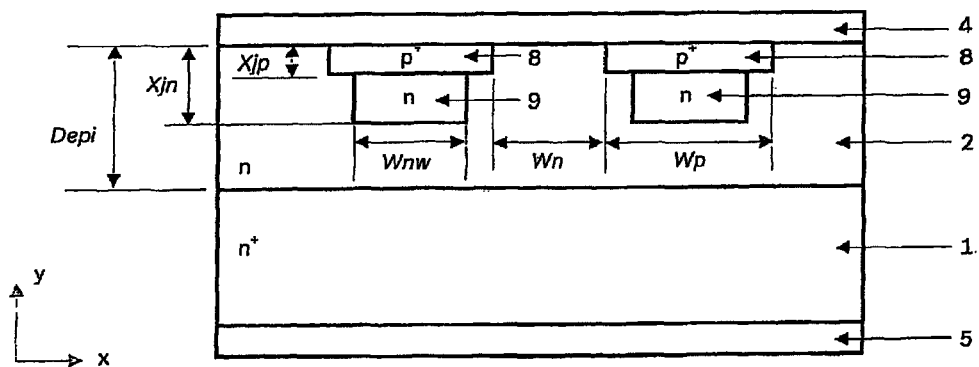
FIGS. 4-6 show another three exemplary embodiments of Schottky diodes according to the present invention.

FIG. 4 shows the second exemplary embodiment of the present invention. The difference from the Schottky diode variant shown in FIG. 3 is that n-wells 9 are implemented by trench technology. The effect of the reduction of the forward voltage with the aid of n-wells 9 is thus still more effective.

Figure 5:
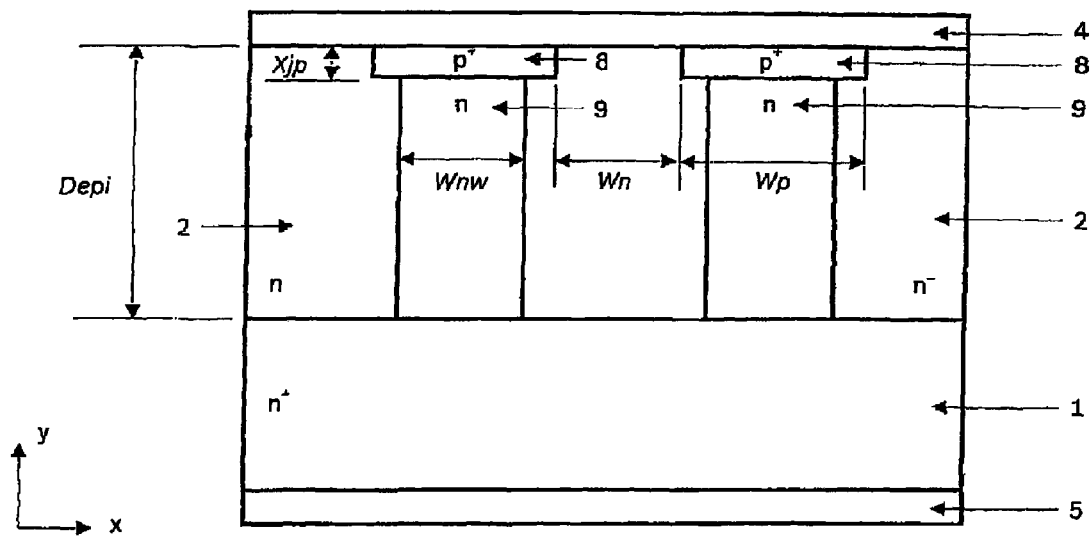

FIG. 5 shows the third exemplary embodiment of the present invention. The difference from the Schottky diode variant shown in FIG. 4 is that n-wells 9 now extend up to $n^+$-substrate 1, or even somewhat into substrate 1. Still another reduction of the forward voltage or optimization with respect to forward voltage, leakage current, and robustness is possible with this variant.

Figure 6:
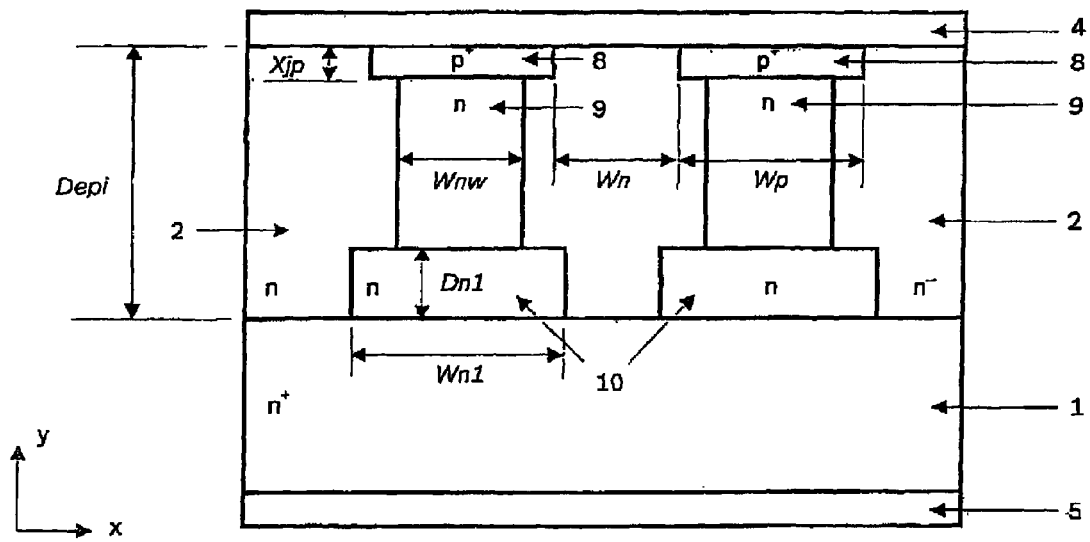

FIG. 6 shows the fourth exemplary embodiment of the present invention. The difference from the Schottky diode variant shown in FIG. 5 is that additional n-wells 10 are located at the base of n-wells 9. These additional n-wells 10 have significantly higher doping concentrations than n-wells 9 and may be implemented, e.g., with the aid of buried layer technology. This variant offers more latitude for optimization with respect to forward voltage, leakage current, and robustness through modification of the doping concentration, width Wn1 and thickness Dn1 of additional n-wells 10.

Possible embodiments of the semiconductor system according to the present invention are as follows:

The metallization of metal layer (4) and/or metal layer (5) may be made up of two or more metal layers lying upon each other.

N-wells (9) may be situated in a strip arrangement or as islands and the islands may be circular or hexagonal or may have any other predefinable shape.

The Schottky contact is formed, for example, from nickel or nickel silicide. The semiconductor material is typically silicon; however, it is also possible that another semiconductor material is used instead of silicon, in particular a wideband gap semiconductor material. For example, the wideband gap semiconductor material is silicon carbide SiC or a semiconductor material based on nitrides.

In the possible Schottky diode variants of the present invention, additional structures may also still be provided in the edge area of the chip to reduce the edge field strength. These may be weakly doped p-areas, magnetoresistors, or similar structures corresponding to the related art, for example.

Possible manufacturing methods of Schottky diode variants of the present invention run as follows:

Variant 1 (for a Schottky diode according to FIG. 3)

Step 1: an $n^+$-substrate is used as starting material 1 for the semiconductor system.

Step 2: n-epitaxial layer 2 is produced with the aid of n-epitaxy.

Step 3: diffusion of n-wells 9 into n-epitaxial layer 2.

Step 4: $p^+$-wells 8 are formed with the aid of diffusion.

Step 5: production of metal layers 4, 5 with the aid of metallization on the front side and rear side of the chip.

Variants 2 and 3 (for Schottky diodes according to FIG. 4 or 5)

Step 1: an $n^+$-substrate is used as starting material 1 for the semiconductor system.

Step 2: n-epitaxial layer 2 is produced with the aid of n-epitaxy.

Step 3: trench etching (up to $n^+$-substrate in variant 3).

Step 4: filling up the trenches using n-doped silicon or polysilicon 9.

Step 5: $p^+$-wells 8 are formed with the aid of diffusion.

Step 6: production of metal layers 4, 5 with the aid of metallization on the front side and rear side of the chip.

Variant 4 (for a Schottky diode according to FIG. 6)

Step 1: an $n^+$-substrate is used as starting material 1 for the semiconductor system.

Step 2: n-epitaxial layer 2 is produced with the aid of n-epitaxy.

Step 3: implantation or diffusion of n-wells 10.

Step 4: second n-epitaxy to produce n-epitaxial layer 2.

Step 5: trench etching up to n-wells 10.

Step 6: filling up the trenches using n-doped silicon or polysilicon 9.

Step 7: diffusion of $p^+$-wells 8.

Step 8: production of metal layers 4, 5 with the aid of metallization on the front side and rear side of the chip.

These steps may optionally still be supplemented by other manufacturing steps.

What is claimed is:

1. A semiconductor system, comprising:
a Schottky diode having an integrated PN diode as a clamping element, which is suitable as a Zener diode having a breakdown voltage of approximately 20 V for use in a motor vehicle generator system, a breakdown voltage of the PN diode being much lower than a breakdown voltage of the Schottky diode, wherein the Schottky diode includes an n-epitaxial layer applied to an $n^+$-substrate of a chip as a cathode zone of the Schottky diode, n-wells in the n-epitaxial layer are provided and are used as a cathode zone of the PN diode, and corresponding $p^+$-wells diffused into the n-epitaxial layer and into the n-wells are provided and are used as an anode zone of the PN diode, wherein the n-wells are implemented in the form of filled trenches, and wherein additional n-wells, having a higher doping concentration in comparison to the n-wells, are located between the n-wells and the $n^+$-substrate.

2. The semiconductor system as recited in claim 1, wherein the semiconductor system may be operated using high currents during breakdown operation.

3. The semiconductor system as recited in claim 1, wherein a metal layer is located on a rear side of the chip and is used as a cathode electrode, and a metal layer is located on a front side of the chip, having ohmic contact to the $p^+$-wells and having Schottky contact to the n-epitaxial layer, and is used as an anode electrode.

4. The semiconductor system as recited in claim 1, wherein a breakdown of the PN diode occurs at a junction between the $p^+$-wells and the n-wells.

5. The semiconductor system as recited in claim 1, wherein a doping concentration of the n-epitaxial layer is much lower than a doping concentration of the n-wells and the n-epitaxial layer has sufficient thickness to implement a much higher breakdown voltage of the Schottky diode in comparison to the breakdown voltage of the integrated PN diode.

6. The semiconductor system as recited in claim 1, wherein the n-wells are implemented in the form of filled trenches, the trenches having one of a rectangular shape or a U-shape.

7. The semiconductor system as recited in claim 1, wherein the n-wells extend up to the $n^+$-substrate.

8. The semiconductor system as recited in claim 1, wherein a width of the n-wells is smaller than a width of the $p^+$-wells and the breakdown occurs at a largely one-dimensional PN junction.

9. The semiconductor system as recited in claim 3, wherein metallization of at least one of the metal layer on the rear side of the chip and the metal layer on the front side of the chip is made up of at least two layers lying upon each other.

10. The semiconductor system as recited in claim 1, wherein the n-wells are situated in a strip arrangement.

11. The semiconductor system as recited in claim 1, wherein the n-wells are situated as islands.

12. The semiconductor system as recited in claim 11, wherein the islands are one of circular or hexagonal.

13. The semiconductor system as recited in claim 3, wherein the Schottky contact is formed from one of nickel or nickel silicide.

14. The semiconductor system as recited in claim 1, wherein the semiconductor system includes a wideband gap semiconductor material.

15. The semiconductor system as recited in claim 14, wherein the wideband gap semiconductor material is one of SiC or a semiconductor material based on nitrides.

16. The semiconductor system as recited in claim 1, wherein additional structures for reducing edge field strength are in an edge area of the chip.

17. The semiconductor system as recited in claim 16, wherein the additional structures are at least one of weakly doped p-areas, and magnetoresistors.

* * * * *